United States Patent
Pagaila (10) Patent No.: US 9,437,482 B2
(45) Date of Patent: Sep. 6, 2016

(54) SEMICONDUCTOR DEVICE AND METHOD OF FORMING SHIELDING LAYER OVER ACTIVE SURFACE OF SEMICONDUCTOR DIE

(71) Applicant: STATS ChipPAC, Ltd., Singapore (SG)

(72) Inventor: Reza A. Pagaila, Tangerang (ID)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/303,484

(22) Filed: Jun. 12, 2014

(65) Prior Publication Data

US 2014/0291820 A1    Oct. 2, 2014

Related U.S. Application Data

(63) Continuation of application No. 13/098,426, filed on Apr. 30, 2011.

(51) Int. Cl.
*H01L 21/44* (2006.01)
*H01L 21/768* (2006.01)
(Continued)

(52) U.S. Cl.
CPC ..... *H01L 21/76805* (2013.01); *H01L 21/3205* (2013.01); *H01L 21/76898* (2013.01); *H01L 23/552* (2013.01); *H01L 24/49* (2013.01); *H01L 24/73* (2013.01); *H01L 2224/02372* (2013.01); *H01L 2224/0401* (2013.01); *H01L 2224/04042* (2013.01); *H01L 2224/05548* (2013.01); *H01L 2224/13025* (2013.01); *H01L 2224/16225* (2013.01); *H01L 2224/32225* (2013.01); *H01L 2224/48091* (2013.01); *H01L 2224/48227* (2013.01); *H01L 2224/48465* (2013.01); *H01L 2224/49107* (2013.01); *H01L 2224/73204* (2013.01); *H01L 2224/73257* (2013.01); *H01L 2224/73265* (2013.01); *H01L 2924/00014* (2013.01); *H01L 2924/01029* (2013.01); *H01L 2924/01322* (2013.01);
(Continued)

(58) Field of Classification Search
CPC ..... H01L 23/62; H01L 23/647; H01L 23/44; H01L 23/64; H01L 23/58; H01L 21/3205
USPC .......... 438/667; 257/660, E21.597, E23.174; 216/17
See application file for complete search history.

(56) References Cited

U.S. PATENT DOCUMENTS

6,392,290 B1    5/2002    Kasem et al.
6,472,723 B1 *  10/2002   Jarstad et al. ............ 257/659
(Continued)

*Primary Examiner* — Caridad Everhart
(74) *Attorney, Agent, or Firm* — Robert D. Atkins; Patent Law Group: Atkins and Associates, P.C.

(57) ABSTRACT

A semiconductor wafer contains a plurality of semiconductor die separated by a non-active area of the semiconductor wafer. A plurality of contact pads is formed on an active surface of the semiconductor die. A first insulating layer is formed over the semiconductor wafer. A portion of the first insulating layer is removed to expose the contact pads on the semiconductor die. An opening is formed partially through the semiconductor wafer in the active surface of the semiconductor die or in the non-active area of the semiconductor wafer. A second insulating layer is formed in the opening in the semiconductor wafer. A shielding layer is formed over the active surface. The shielding layer extends into the opening of the semiconductor wafer to form a conductive via. A portion of a back surface of the semiconductor wafer is removed to singulate the semiconductor die.

20 Claims, 6 Drawing Sheets

(51) Int. Cl.
*H01L 23/552* (2006.01)
*H01L 23/00* (2006.01)
*H01L 21/3205* (2006.01)

(52) U.S. Cl.
CPC ............... *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/19107* (2013.01); *H01L 2924/3011* (2013.01); *H01L 2924/3025* (2013.01)

(56) References Cited

U.S. PATENT DOCUMENTS

| | | | |
|---|---|---|---|
| 6,838,748 B2 | 1/2005 | Ishio et al. | |
| 7,445,968 B2 | 11/2008 | Harrison et al. | |
| 7,528,010 B2 | 5/2009 | Otremba et al. | |
| 7,573,124 B2 | 8/2009 | Wang et al. | |
| 7,701,057 B1* | 4/2010 | Rahman et al. | 257/750 |
| 8,692,381 B1* | 4/2014 | Hart | H01L 29/66181 257/774 |
| 2004/0256643 A1 | 12/2004 | Chuang et al. | |
| 2005/0167849 A1* | 8/2005 | Sato | H01L 23/3121 257/778 |
| 2006/0027934 A1 | 2/2006 | Edelstein et al. | |
| 2007/0052067 A1* | 3/2007 | Umemoto | 257/587 |
| 2007/0267725 A1 | 11/2007 | Lee et al. | |
| 2008/0012119 A1* | 1/2008 | Otremba | H01L 21/78 257/698 |
| 2008/0116544 A1* | 5/2008 | Grinman | H01L 23/3114 257/659 |
| 2008/0116584 A1* | 5/2008 | Sitaram | 257/777 |
| 2008/0136016 A1 | 6/2008 | Hess et al. | |
| 2008/0157295 A1* | 7/2008 | Nuytkens | H01L 23/552 257/659 |
| 2009/0115026 A1 | 5/2009 | Gerber et al. | |
| 2009/0134500 A1* | 5/2009 | Kuo | 257/659 |
| 2009/0184414 A1* | 7/2009 | Park | H01L 21/561 257/698 |
| 2009/0242076 A1* | 10/2009 | Janeau et al. | 141/324 |
| 2010/0001378 A1 | 1/2010 | DeNatale et al. | |
| 2010/0068433 A1 | 3/2010 | Gibanel et al. | |
| 2010/0078778 A1* | 4/2010 | Barth | H01L 21/568 257/659 |
| 2010/0081236 A1 | 4/2010 | Yang et al. | |
| 2010/0105171 A1* | 4/2010 | Lee et al. | 438/113 |
| 2010/0230795 A1* | 9/2010 | Kriman | H01L 23/481 257/686 |
| 2011/0068433 A1 | 3/2011 | Kim et al. | |
| 2011/0095373 A1* | 4/2011 | Hwang | H01L 21/76898 257/368 |
| 2011/0133333 A1 | 6/2011 | Kwon et al. | |
| 2011/0139497 A1 | 6/2011 | Li et al. | |
| 2012/0025354 A1* | 2/2012 | Sasaki et al. | 257/620 |
| 2012/0074582 A1* | 3/2012 | Yu | H01L 21/486 257/774 |

* cited by examiner

SEMICONDUCTOR DEVICE AND METHOD OF FORMING SHIELDING LAYER OVER ACTIVE SURFACE OF SEMICONDUCTOR DIE

CLAIM OF DOMESTIC PRIORITY

The present application is a continuation of U.S. patent application Ser. No. 13/098,426, filed Apr. 30, 2011, which application is incorporated herein by reference.

FIELD OF THE INVENTION

The present invention relates in general to semiconductor devices and, more particularly, to a semiconductor device and method of forming an EMI and RFI shielding layer over an active surface and side surfaces of a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk, which can interfere with device operation.

Semiconductor devices commonly use a metal shielding layer mounted to an encapsulant formed over the semiconductor die to reduce EMI and RFI. The shield layer is typically electrically connected through a build-up interconnect structure to a low impedance ground point to dissipate the EMI and RFI energy.

SUMMARY OF THE INVENTION

A need exists to isolate semiconductor die from EMI, RFI, and other inter-device interference. Accordingly, in one embodiment, the present invention is a method of making a semiconductor device comprising the steps of providing a semiconductor die, forming an opening around a perimeter and partially through the semiconductor die, and forming a conductive layer over a first surface of the semiconductor die and into the opening to operate as a shielding layer over the semiconductor die.

In another embodiment, the present invention is a method of making a semiconductor device comprising the steps of providing a semiconductor die, forming an opening in a first surface of the semiconductor die, and forming a shielding layer over the first surface of the semiconductor die and into the opening of the semiconductor die.

In another embodiment, the present invention is a semiconductor device comprising a semiconductor die including an opening formed in a surface around a perimeter of the semiconductor die. A conductive layer is formed over the surface of the semiconductor die and into the opening to operate as a shielding layer over the semiconductor die.

In another embodiment, the present invention is a semiconductor device comprising a semiconductor die including an opening in a surface of the semiconductor die. A shielding layer is formed over the surface of the semiconductor die and into the opening of the semiconductor die.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
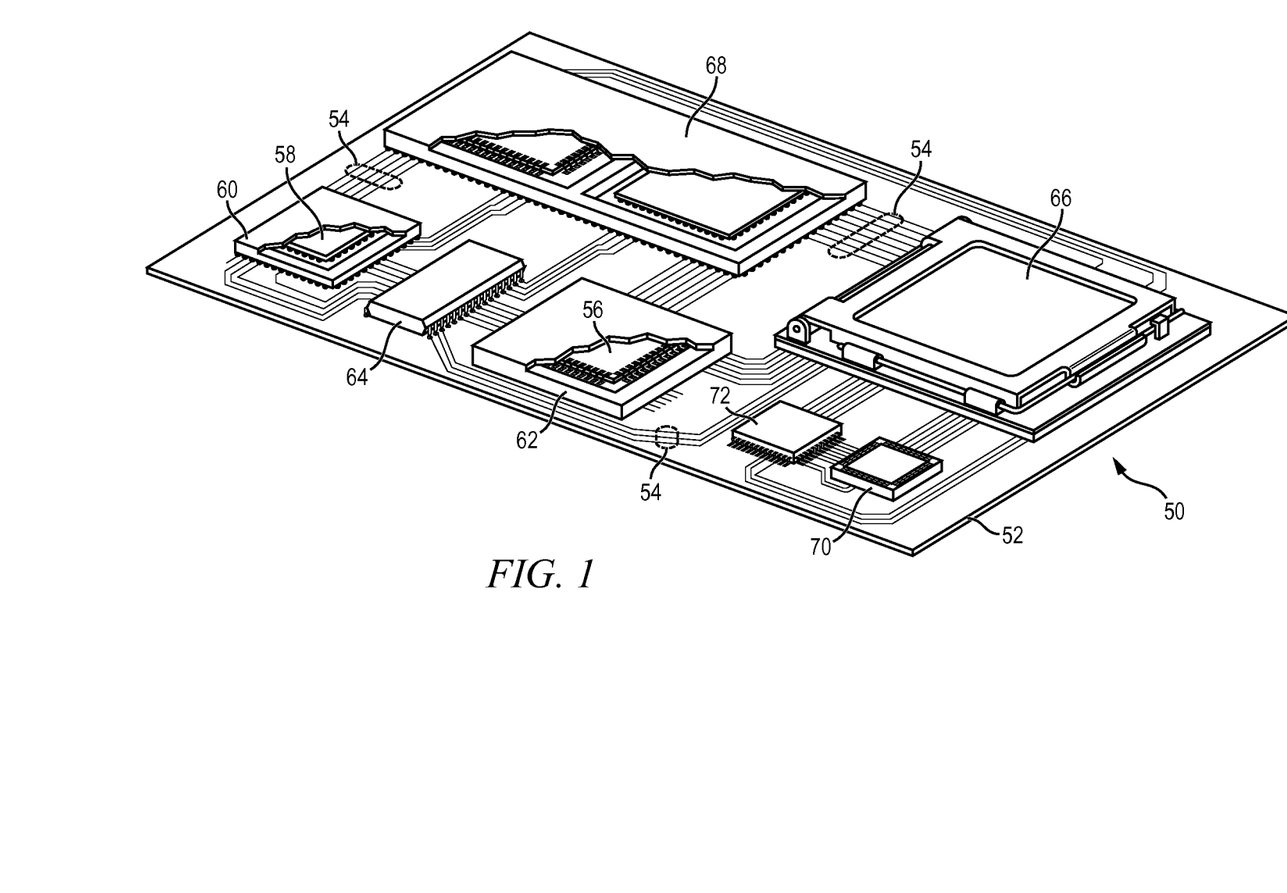
FIG. 1 illustrates a PCB with different types of packages mounted to its surface.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
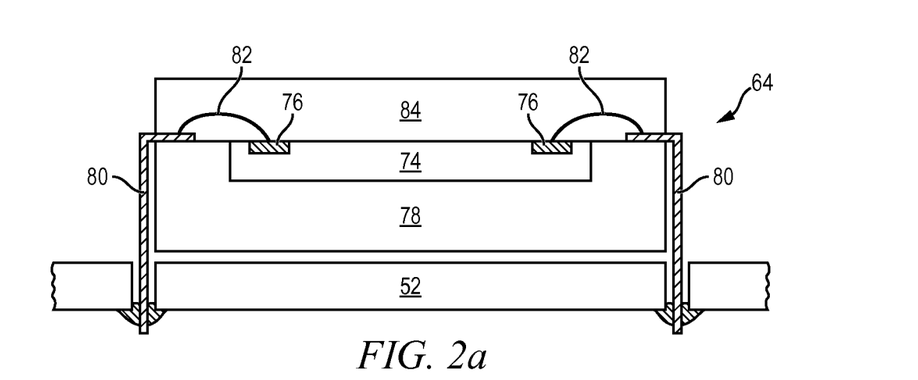
FIGS. 2a-2c illustrate further detail of the representative semiconductor packages mounted to the PCB.
Figure 2B:
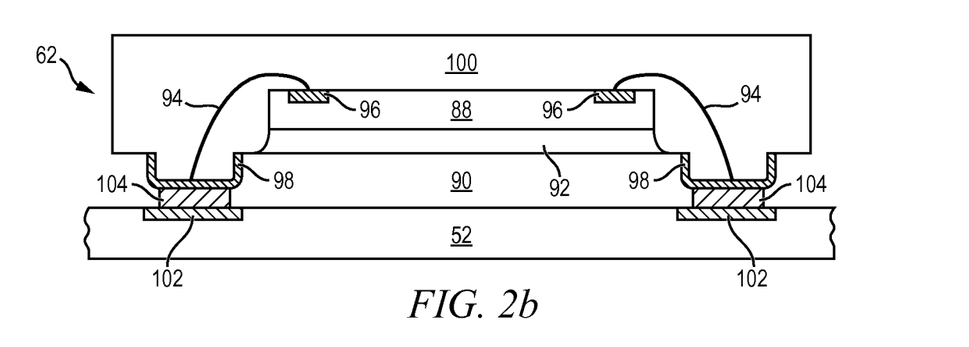
Figure 2C:
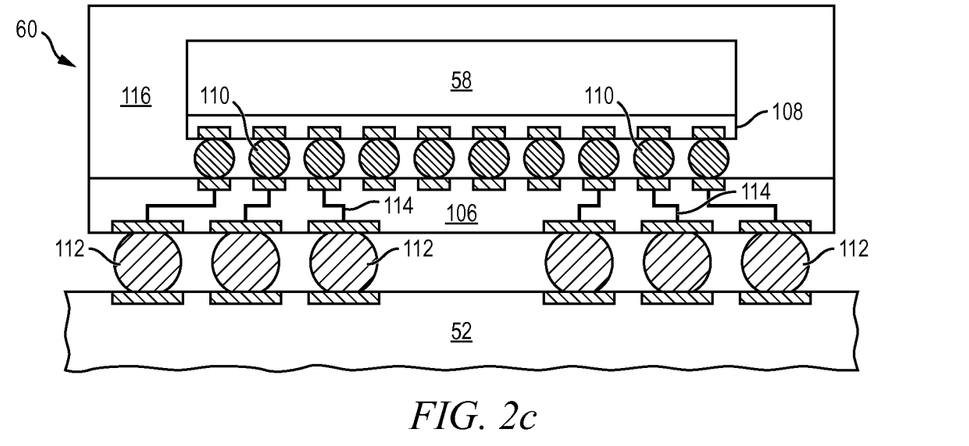

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
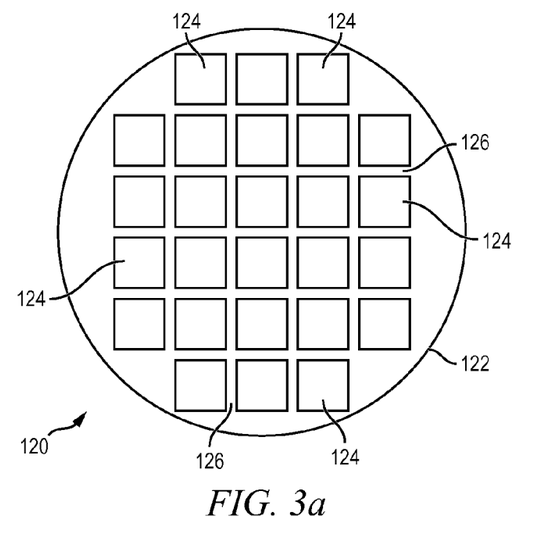
FIGS. 3a-3h illustrate a process of forming an EMI and RFI shielding layer over an active surface and side surfaces of a semiconductor die.

FIGS. 3a-3h illustrate, in relation to FIGS. 1 and 2a-2c, a process of forming an EMI and RFI shielding layer over an active surface and side surfaces of a semiconductor die. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor die 124 may have dimensions ranging from 2×2 millimeters (mm) to 15×15 mm.

Figure 3B:
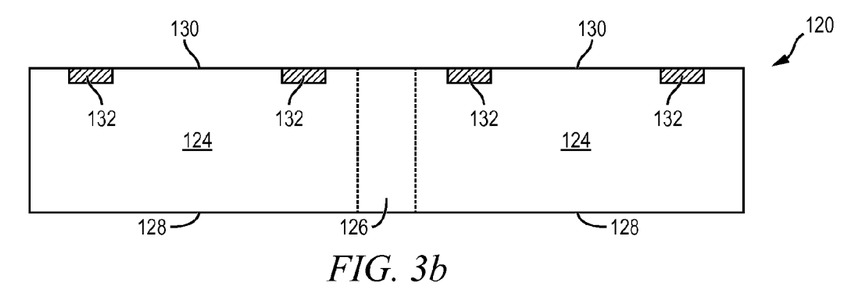

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPD), such as inductors, capacitors, and resistors, for RF signal processing. Semiconductor die 124 can be a flipchip type die, wire-bonded die, or conductive through silicon via (TSV) die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
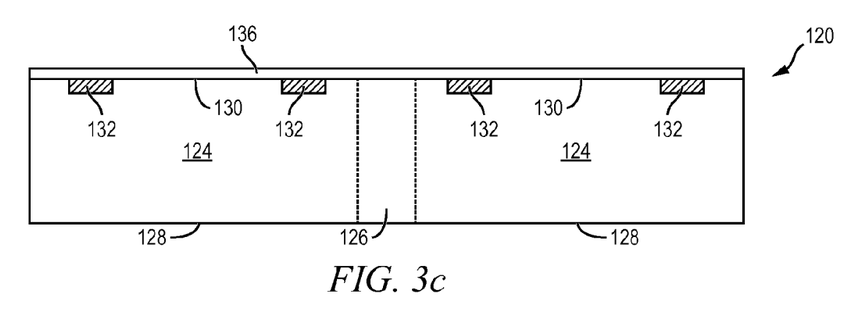
Figure 3D:
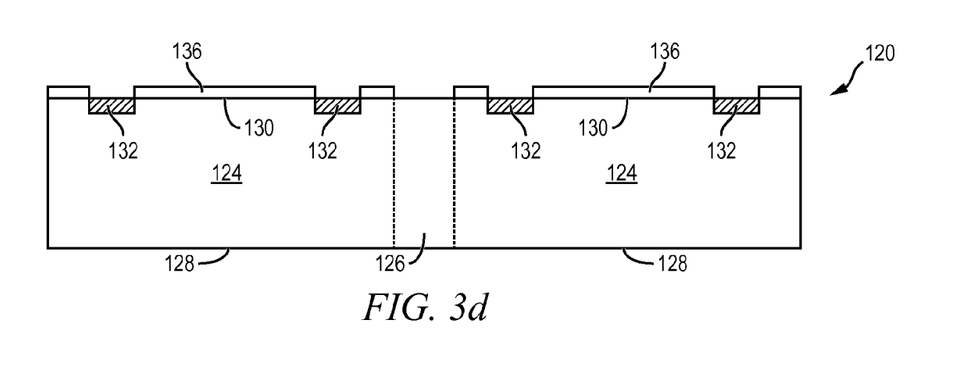

In FIG. 3c, an insulating or passivation layer 136 is formed over active surface 130 while in wafer form using PVD, CVD, printing, spin coating, spray coating, sintering or thermal oxidation. The insulating layer 136 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The blanket insulating layer 136 completely covers active surface 130. A portion of insulating layer 136 is removed by an etching process to expose conductive layer 132 and saw street 126, as shown in FIG. 3d.

Figure 3E:
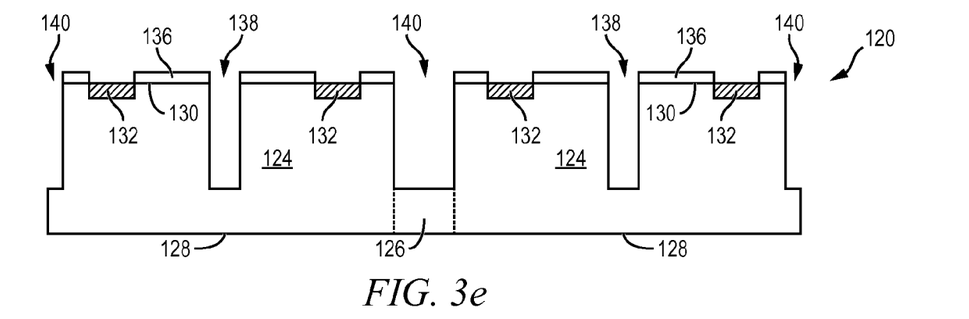

In FIG. 3e, a plurality of blind vias or openings 138 is formed into active surface 130 between conductive layer 132 using mechanical drilling, laser drilling, or deep reactive ion etching (DRIE). Each semiconductor die 124 can contain one or more blind vias 138. In addition or alternatively, a partial trench or opening 140 is formed along saw street 126 around a perimeter of semiconductor die 124 using mechanical drilling, laser drilling, or DRIE. Vias 138 and trench 140 extend partially but not completely through semiconductor wafer 120. In one embodiment, vias 138 and trench 140 are cut through 60% of the thickness of semiconductor wafer 120. The remaining portion of semiconductor wafer 120 between vias 138 and trench 140 and back surface 128 provide structural support for the wafer during subsequent manufacturing processes.

Figure 3F:
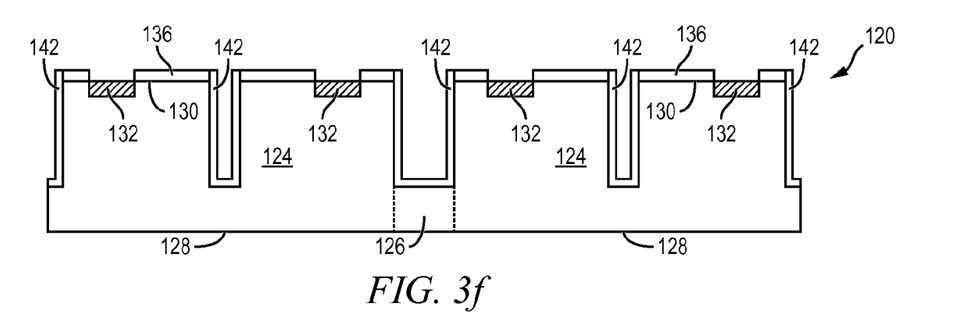

In FIG. 3f, an insulating or passivation layer 142 is conformally applied into blind vias 138 and partial trench 140 using PVD, CVD, printing, spin coating, spray coating, sintering or thermal oxidation. The insulating layer 142 contains one or more layers of SiO2, Si3N4, SiON, Ta2O5, Al2O3, or other material having similar insulating and structural properties. The insulating layer 142 follows the contour of vias 138 and trench 140 and may also cover insulating layer 136.

Semiconductor die 124 may contain baseband circuits that generate EMI, RFI, or other inter-device interference, such as capacitive, inductive, or conductive coupling. In other embodiments, semiconductor die 124 contain IPDs that are susceptible to EMI, RFI, and inter-device interference. For example, the IPDs contained within semiconductor die 124 provide the electrical characteristics needed for high frequency applications, such as resonators, high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun is dedicated for a frequency band of operation of the quad-band device. A typical RF system requires multiple IPDs and other high frequency circuits in one or more semiconductor packages to perform the necessary electrical functions.

Figure 3G:
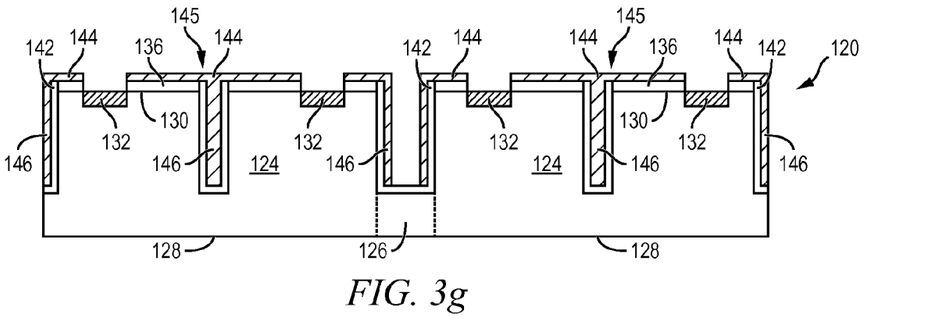

In FIG. 3g, an electrically conductive layer 144 is conformally deposited over insulating layers 136 and 142 covering active surface 130 while in wafer form using a patterning and metal deposition process such as electrolytic plating, and electroless plating, sputtering, PVD, CVD, or other suitable metal deposition process. In one embodiment, conductive layer 144 is substantially flat with a thickness of 5-25 micrometers (μm) and follows the contour of insulating layers 136 and 142 over active surface 130 and into vias 138 and trench 140. Conductive layer 144 is patterned so as to not cover conductive layer 132, i.e., to leave the contact pads of semiconductor die 124 exposed. The portion of conductive layer 144 over active surface 130 operates as a shielding layer 145 to reduce the effects of EMI and RFI. Conductive layer 144 can be one or more layers of Al, Cu, Sn, Ni, Au, Ag, or other suitable electrically conductive material. Shielding layer 145 over active surface 130 can also be ferrite or carbonyl iron, stainless steel, nickel silver, low-carbon steel, silicon-iron steel, foil, conductive resin, conductive paste, and other metals and composites capable of blocking or absorbing EMI, RFI, and other inter-device interference. Shielding layer 145 is electrically isolated from the circuits on active surface 130 by insulating layers 136 and 142.

In another embodiment, the portion of shielding layer 145 over active surface 130 can also be a non-metal material such as carbon-black or aluminum flake to reduce the effects of EMI and RFI. For non-metal materials, shielding layer 145 can be applied by lamination, spraying, or painting.

The deposition of conductive layer 144 extends into vias 138 and trench 140 to cover the sidewalls of the vias and trench and form z-direction blind conductive through silicon vias (TSV) 146. Alternatively, conductive layer 144 completely fills vias 138 and trench 140 to form the z-direction blind conductive TSV 146. The portion of conductive layer 144 in trenches 140 operates as a shielding layer to reduce the effects of EMI and RFI with respect to the side surfaces of semiconductor die 124. Accordingly, the shielding layer covers a top portion and side portion of each semiconductor die 124 while in the form of semiconductor wafer 120.

Figure 3H:
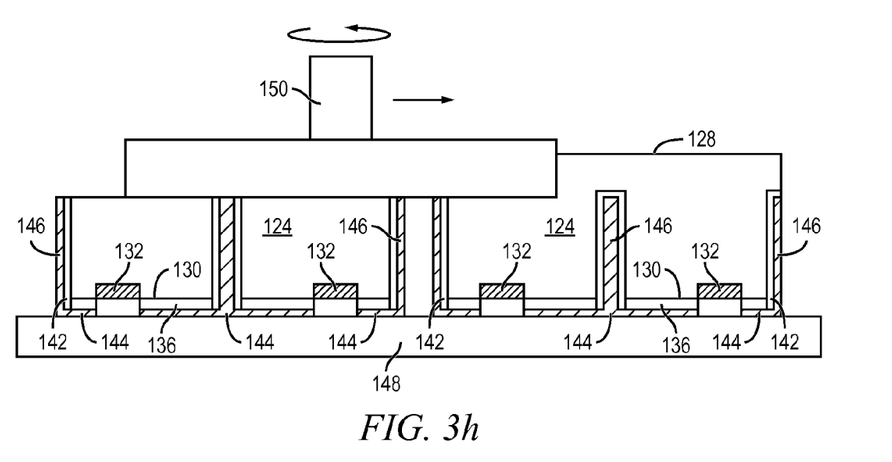

In FIG. 3h, semiconductor wafer 120 is inverted and mounted with active surface 130 oriented to carrier or backgrinding tape 148. A portion of back surface 128 of semiconductor wafer 120 is removed by grinder 150 to expose conductive TSV 146 and singulate the wafer into separate semiconductor die 124. The individual semiconductor devices 152, including semiconductor die 124 and overlying shielding layer 145, are removed from carrier 148.

Figure 4A:
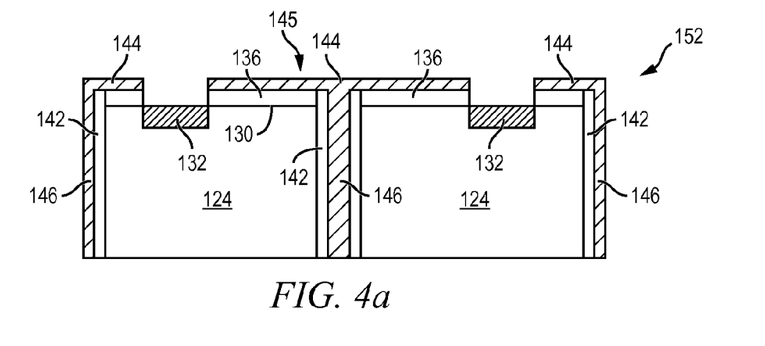
FIGS. 4a-4b illustrate the shielding layer formed over the active surface and side surfaces of the semiconductor die.
Figure 4B:
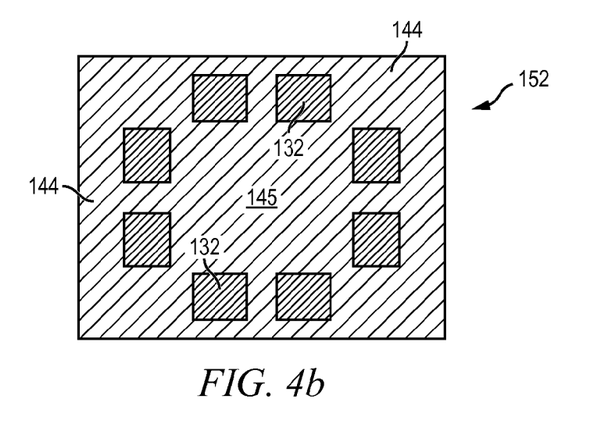

FIGS. 4a-4b show a cross-section view and top view of semiconductor device 152 after singulation. The flat shielding layer 145 is readily formed over active surface 130 of semiconductor die 124 to block or absorb EMI, RFI, and other inter-device interference. The wafer-level shielding layer 145 provides high productivity in terms of manufacturing units per hour (UPH) at lower production cost for semiconductor device 152. The flat shielding layer 145 also reduces height of semiconductor device 152. Shielding layer 145 provides EMI coverage over active surface 130 and around the edges and sides of semiconductor die 124 and routes EMI, RFI, and other interfering signals through conductive TSV 146 an external low-impedance ground point. Accordingly, the flat shielding layer 145 provides effective EMI and RFI shielding for active surface 130, as well as the edges and side surfaces of semiconductor die 124.

Figure 5:
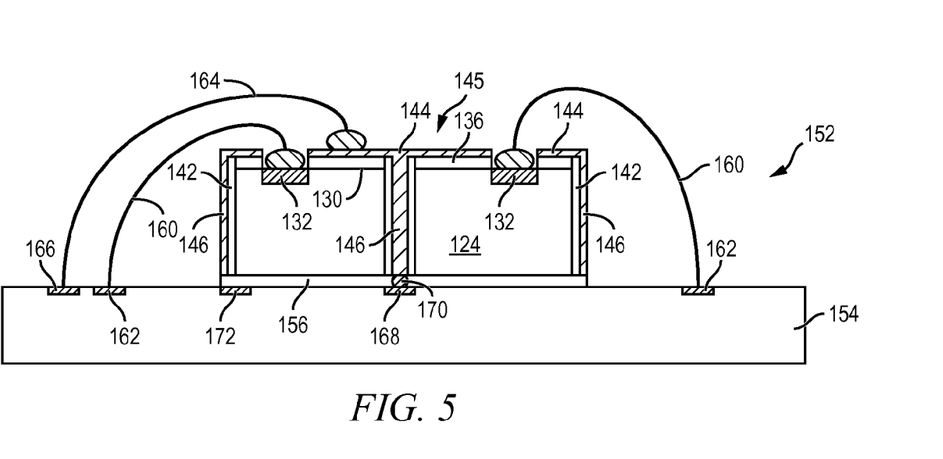
FIG. 5 illustrates the semiconductor die with shielding layer mounted to a substrate.

FIG. 5 shows semiconductor device 152 mounted to substrate or PCB 154 with die attach adhesive or conductive adhesive 156, such as epoxy resin or conductive paste. Bond wires 160 are formed between contact pads 132 of semiconductor die 124 and conductive traces 162 formed within substrate 154 for power supply connections and signal transmission between the die and substrate. As a first option in grounding shielding layer 145, bond wire 164 is formed between a top surface of the shielding layer and conductive trace 166 within substrate 154 to provide an external low-impedance ground point. As a second option in grounding shielding layer 145, conductive TSV 146 can be electrically connected to conductive trace 168 of substrate 154 with bump 170 to provide an external low-impedance ground point. As a third option in grounding shielding layer 145, conductive TSV 146 can be electrically connected through conductive adhesive 156 deposited between semiconductor die 124 and substrate 154 to conductive trace 172, which provides an external low-impedance ground point. Conductive adhesive 156 also provides EMI and RFI shielding for the back surface of semiconductor die 124.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
providing a semiconductor wafer including a plurality of semiconductor die with a plurality of contact pads formed over an active surface of the semiconductor die;
forming a first opening into the active surface of the semiconductor die with the first opening extending partially through the semiconductor wafer;
forming a second opening into a saw street in an inactive area of the semiconductor wafer between the semiconductor die with the second opening extending partially through the semiconductor wafer;
forming a conductive layer over the active surface of the semiconductor die and into the first opening and second opening to operate as a shielding layer extending over the active surface, into the first opening, and around side surfaces of the semiconductor die; and
removing a portion of the semiconductor wafer opposite the active surface of the semiconductor die, wherein after removing the portion of the semiconductor wafer the first opening extends from the active surface of the semiconductor die through the semiconductor die to reach a second surface of the semiconductor die opposite the active surface of the semiconductor die.

2. The method of claim 1, further including forming an insulating layer over the active surface of the semiconductor die.

3. The method of claim 1, further including forming an insulating layer in the first opening and second opening prior to forming the conductive layer.

4. The method of claim 1, further including forming an interconnect structure between the conductive layer and a ground point.

5. A method of making a semiconductor device, comprising:
providing a plurality of semiconductor die including a semiconductor material;
forming a first opening through an active surface of the semiconductor die with the first opening extending into the semiconductor material of the semiconductor die;
forming a second opening in a saw street between the semiconductor die; and
forming a shielding layer over the active surface of the semiconductor die and into the first opening and second opening with the shielding layer covering a side surface of the semiconductor die, wherein the shielding layer is electrically isolated from the active surface of the semiconductor die.

6. The method of claim 5, further including forming an insulating layer over the active surface of the semiconductor die.

7. The method of claim 5, further including forming an insulating layer in the second opening between the semiconductor die.

8. The method of claim 5, further including forming an interconnect structure between the shielding layer and a ground point.

9. The method of claim 5, further including removing a portion of the semiconductor die opposite the active surface of the semiconductor die.

10. The method of claim 9, wherein after removing the portion of the semiconductor die the first opening extends from the active surface of the semiconductor die completely through the semiconductor die to a second surface of the semiconductor die opposite the active surface.

11. A semiconductor device, comprising:
a semiconductor die including an opening formed in an active surface of the semiconductor die and extending from the active surface of the semiconductor die through the semiconductor die to reach a second surface of the semiconductor die opposite the active surface; and
a conductive layer formed over the active surface of the semiconductor die and extending over a side surface of the semiconductor die and into the opening to operate as a shielding layer over the semiconductor die.

12. The semiconductor device of claim 11, further including an insulating layer formed over the semiconductor die.

13. The semiconductor device of claim 11, further including an insulating layer formed in the opening in the semiconductor die.

14. The semiconductor device of claim 11, further including an interconnect structure formed over the conductive layer.

15. The semiconductor device of claim 11, wherein the conductive layer is conformally applied over a sidewall of the opening.

16. A semiconductor device, comprising:
a semiconductor die including an opening in an active surface of the semiconductor die; and
a shielding layer formed over the active surface of the semiconductor die and a side surface of the semiconductor die with the shielding layer extending into the opening in the active surface of the semiconductor die, wherein the opening extends from the active surface of the semiconductor die completely through the semiconductor die to a second surface of the semiconductor die opposite the active surface.

17. The semiconductor device of claim 16, further including an insulating layer formed over the semiconductor die.

18. The semiconductor device of claim 16, further including an interconnect structure formed over the shielding layer.

19. A semiconductor device, comprising:
   a semiconductor die including an opening in an active surface of the semiconductor die; and
   a shielding layer formed over the active surface of the semiconductor die and a side surface of the semiconductor die with the shielding layer extending into the opening in the active surface of the semiconductor die, wherein the shielding layer is electrically isolated from the active surface of the semiconductor die.

20. The semiconductor device of claim 19, wherein the shielding layer is conformally applied over the active surface of the semiconductor, side surface of the semiconductor die, and into the opening.

* * * * *